United States Patent [19]
Toner et al.

[11] Patent Number: 5,645,210
[45] Date of Patent: Jul. 8, 1997

[54] HIGH SPEED BONDING TOOL CONTACT DETECTOR

[75] Inventors: Eugene Michael Toner, Quakertown; Avner Guez, Dresher, both of Pa.

[73] Assignee: Kulicke and Soffa Investments, Inc., Wilmington, Del.

[21] Appl. No.: 598,986

[22] Filed: Feb. 9, 1996

[51] Int. Cl.$^6$ ................................................. H01L 21/607
[52] U.S. Cl. ........................... 228/102; 228/8; 228/1.1; 228/110.1
[58] Field of Search ........................... 228/102, 110.1, 228/180.5, 1.1, 8, 4.5; 310/316

[56] References Cited

U.S. PATENT DOCUMENTS

| | | | |
|---|---|---|---|
| 4,824,005 | 4/1989 | Smith, Jr. ........................... | 228/110.1 |
| 5,046,654 | 9/1991 | Yamazaki et al. .................. | 228/1.1 |
| 5,357,423 | 10/1994 | Weaver et al. ..................... | 228/110.1 |
| 5,386,936 | 2/1995 | Mochida et al. ................... | 228/110.1 |
| 5,494,207 | 2/1996 | Asanasavest ....................... | 228/110.1 |

*Primary Examiner*—Samuel M. Heinrich
*Attorney, Agent, or Firm*—John B. Sowell

[57] ABSTRACT

There is provided an ultrasonic generator of the type having a power amplifier. The output of the power amplifier is connected across and through an ultrasonic transducer which holds a bonding tool to be engaged on a bonding target. A current sufficient to induce a resonant frequency is applied across the ultrasonic transducer in air and before touch down on the bonding target while continuously monitoring the current and voltage across the transducer. A touch down detector circuit is coupled to the current and voltage being monitored and initiates a touch down signal which is employed to control these Z-axis drive motor of an automatic wire bonder within several microseconds of the actual touch down time.

13 Claims, 5 Drawing Sheets

HIGH SPEED BONDING TOOL CONTACT DETECTOR

BACKGROUND OF THE INVENTION

1. Field of the Invention

The present invention relates to high speed automatic wire bonders and to wire bonding monitoring systems. More specifically, the present invention relates to a high speed detecting circuit for detecting the touch down of a bonding tool onto a bonding target prior to performing a bonding operation.

2. Description of the Prior Art

Automatic wire bonders are designed to make over ten distinct bonds per second on the pads of a semiconductor chip or the fingers of lead frames or on chip carriers. The targets to be bonded vary in height by several one thousandths (Mils) of an inch. The bonding tool at maximum velocity is being driven toward the bonding target at speeds up to 25,000 Mils per second. In order to avoid crashing the bonding tool into a bonding target, it has been heretofore the accepted practice to perform a teach operation in which a touch down Z-axis position is determined for all bonding targets to be bonded. The automatic wire bonder is then employed to calculate a Z-axis position above all of the touch down positions commonly known in this industry as an inflection point. When the bonding tool is driven toward a bonding target, it passes through the predetermined inflection point at which time the velocity of the bonding tool is changed to a lesser and controlled constant velocity which continues until the time of impact and touch down occurs. This impact/touch down velocity is controlled to avoid producing a destructive impact force or a force which would affect the quality of a bond on a semiconductor device.

The bonding force employed to affect a proper first or second bond is actuated after impact force and touch down, however, ultrasonic energy imparted to the bonding tool may be started before or after touch down. Different problems presented by different semiconductor chips and lead frames and carriers require that present day automatic wire bonders be capable of bonding all different types of semiconductor chips and lead frames using bonding parameters determined during setup and/or teach operations.

Most operators of automatic wire bonders attempt to produce the strongest possible wire bonds in a minimum or nominal time for making an interconnection while maintaining maximum continuous operation before assistance of the bonding machine. The result determines the maximum throughput of acceptable products. Our U.S. Pat. Nos. 4,266,710; 4,586,642, 4,808,948 and 5,111,989 show and describe methods and means for controlling such wire bonding operations to effect maximum throughput. These patents are assigned to the same assignee as the present invention and are generally classified in U.S. Class 228, Sub-Classes 4.5, 1.10, 1.79, etc. As will be explained in greater detail hereinafter such prior art wire bonders have a built-in safety factor and reduce the maximum approach velocity of the bonding tool well before impact on the bonding target.

It would be highly desirable to provide a method and means for sensing the touch down point of a bonding tool on a bonding target at speeds that are so high that the detrimental effect of high speed impact forces can be controlled after impact which was not possible heretofore.

SUMMARY OF THE INVENTION

It is a primary object of the present invention to provide a high speed detector circuit for detecting touch down of a bonding tool on a bond target during a high speed bonding operation.

It is a primary object of the present invention to provide a bonding tool touch down detector for controlling force applied by a Z-axis drive motor within microseconds after a high velocity touch down occurs.

It is a primary object of the present invention to provide an electronic logic circuit which effectively senses the change in phase which occurs between the current and voltage being applied across an ultrasonic transducer at the time of touch down of the bonding tool on a bonding target and using this information to control the force on the Z-axis motor.

It is another primary object of the present invention to actuate an ultrasonic transducer at its resonance frequency while in air and before touching down and to sense the phase shift, the current change, the impedance change or the frequency change which occurs at the instant of touch down of the bonding tool.

It is another primary object of the present invention to provide an impact detector for controlling the impact force of a high speed bonding tool within several cycles of the no-load transducer frequency driving current which permits response control of the Z-axis drive motor before a bonding force is applied.

It is another object of the present invention to sense the time of touch down of a bonding tool in under one hundred microseconds and to effect change of the force applied by the Z-axis drive motor from a no-load velocity/position mode to a bond force mode before a bond force current is applied in the force mode.

It is a general object of the present invention to provide a high speed bonding tool touch down detector which substantially reduces the total bonding time for making either ultrasonic wire bonds or thermosonic wire bonds.

It is a general object of the present invention to provide a high speed bonding tool touch down detector which greatly simplifies bonding operations as well as set-up time for bonding operations.

It is a general object of the present invention to speed up the time for sensing touch down of a bonding tool by several orders of magnitude so as to simplify design and control of a Z-axis drive servomotor.

According to these and other objects of the present invention, there is provided an ultrasonic generator for driving a ultrasonic transducer. A voltage sensing circuit and a current sensing circuit are connected across the transducer coupled to the ultrasonic generator. A small current sufficient to induce resonant frequency in the transducer is applied across the transducer in air and before touch down while continuously monitoring the current and voltage across the transducer. A touch down detector circuit is coupled to one of more of the monitored values initiates: a touch down signal which is employed to control the Z-axis drive motor of an automatic wire bonder before a bonding force can be applied.

DESCRIPTION OF THE PREFERRED EMBODIMENTS

Figure 1:
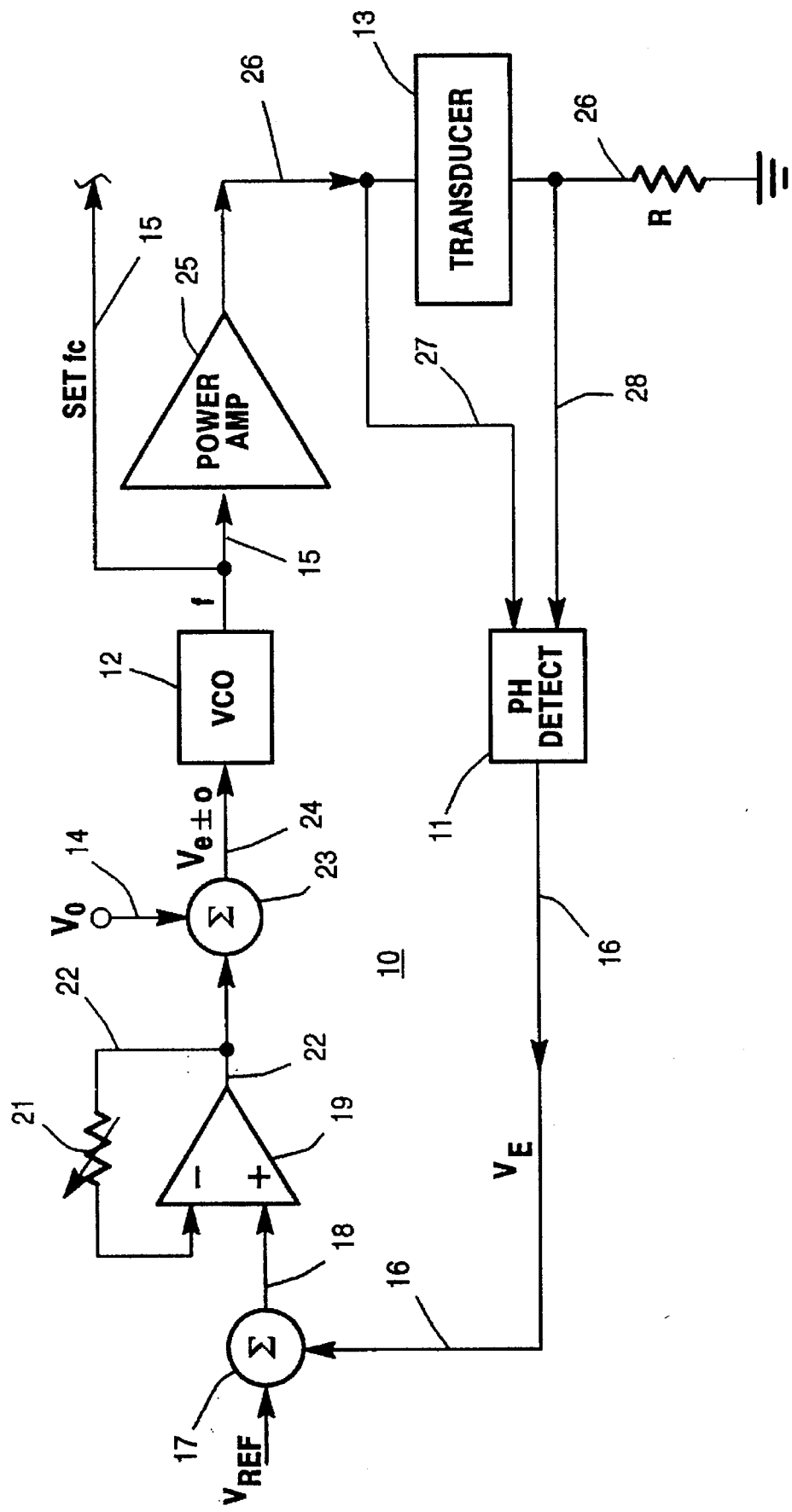
FIG. 1 is schematic diagram of a prior art manually adjustable phase lock loop for an ultrasonic generator.

Refer now to FIG. 1 showing a schematic block diagram of a prior art manually adjustable phase lock loop 10 employing a phase detector 11 to control the frequency of a voltage controlled oscillator (VCO) 12. This phase lock loop 10 is shown and described in U.S. Pat. No. 4,808,948 and is employed there to describe the problem which exists with all ultrasonic transducers used in all types of wire bonders.

Regardless of the precision used to manufacture ultra sonic transducers 13, their resonant frequency ($F_C$) varies one from another. Even when the same transducer 13 is removed from one bonding machine (not shown) and placed on another bonding machine, the resonant frequency $F_C$ must be returned to the center frequency. Fortunately, the resonant frequency $F_C$ in air and not under load occurs when the phase of the voltage sensed ($V_S$) coincides with the current phase of the current ($I_S$) sensed as a voltage is imposed across the transducer.

In the system shown, the center frequency in air ($F_C$) is set at no load by adjusting the offset voltage ($V_o$) on line 14 and observing the output of the VCO 12 on line 15. If the center frequency $F_C$ falls well within the specifications for the transducer window and the VCO adjustment window, it was presumed that the phase lock loop 10 would correct for the change in resonant frequency under load. With $F_C$ set at $F_{CAIR}$ and the phase difference between $V_S$ and $I_S$ at zero, the transducer 13 is loaded when a bonding operation is initiated. The phase difference (ΔPH) sensed at phase detector 11 on line 16 is a voltage error signal $V_E$. The signal $V_E$ on line 16 is applied to a summing device 17 which has a second input shown as a reference voltage signal for adjusting $V_E$ to obtain zero phase during setup. The output of the summing device 17 on line 18 is applied to an amplifier 19 having a manually adjustable control 21 in feedback loop path 22. The voltage error signal $V_E$ on line 22 is zero when $V_S$ and $I_S$ are in phase but appears as a positive or negative voltage $V_E$ at the output of the summing device 23 on line 24 as an input to the VCO when they are out of phase. The VCO output on line 15 is applied to a power amplifier 25 to produce a load current $I_L$ on line 26. The voltage across the transducer 13 $V_S$ is sensed on line 27 and the current $I_L$ is sensed on line 28 as a voltage across the calibrated resistor R.

The phase lock loop thus described attempts to reduce the phase error on line 16 to zero by changing the frequency of the VCO in a conventional manner employing either a digital or an analog phase detector 11.

Figure 2:
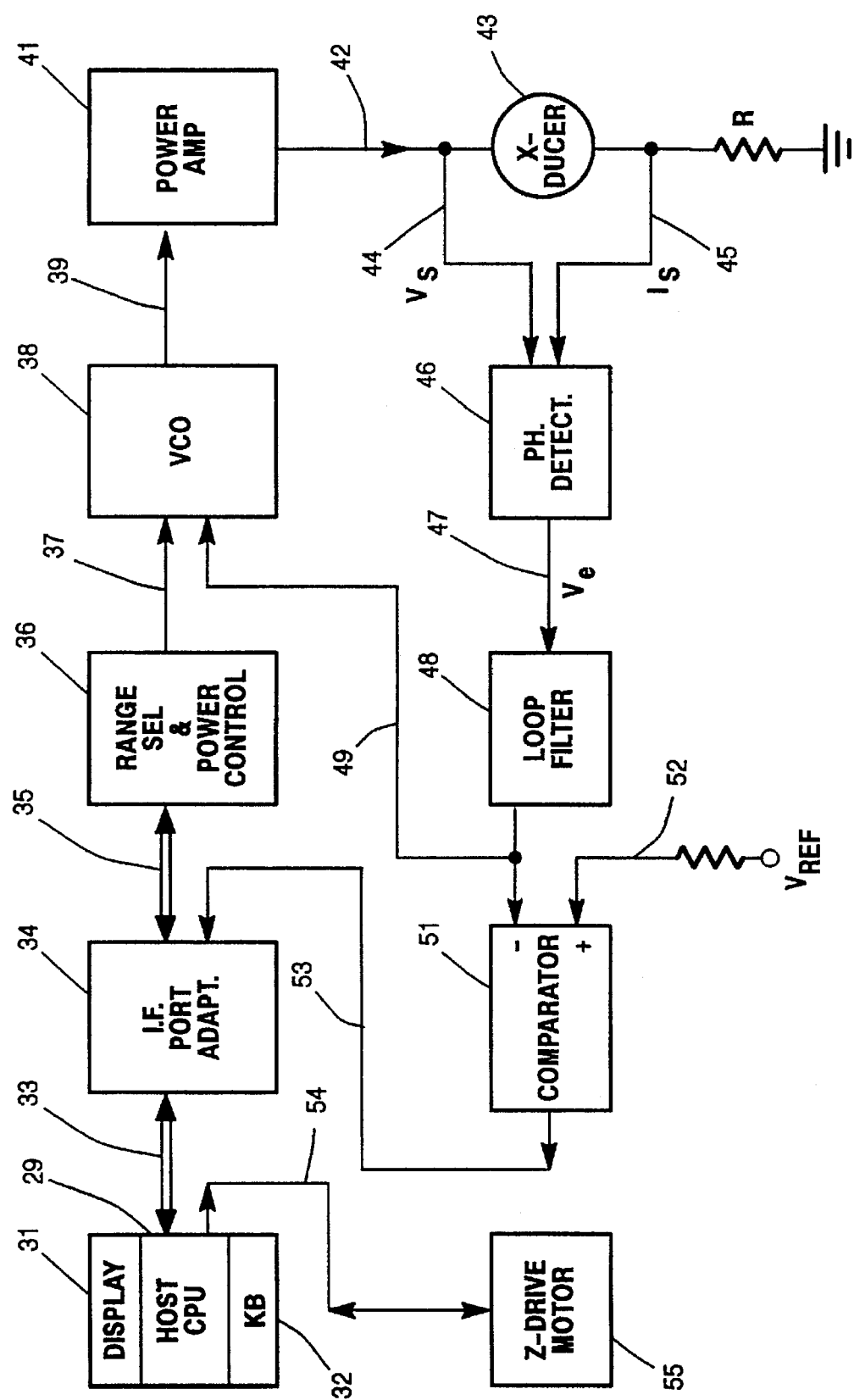
FIG. 2 is a schematic block diagram of the phase lock loop of the FIG. 1 modified to automatically control a Z-axis drive motor of an automatic wire bonder immediately after sensing touch down of the bonding tool on a bonding target.

Refer now to FIG. 2 showing a schematic block diagram of a phase lock loop of the type shown in FIG. 1 modified to automatically control a Z-drive motor immediately after detecting touch down of the bonding tool on a bonding target. In the preferred embodiment shown, a host CPU 29 is provided in the automatic wire bonder with a display 31 and a keyboard 32 for following menus and setting up desirable programs. The information programmed in the host CPU connects through a bus 33 to I/O port adapters 34 which may be internal and on boards in the CPU 29. Further, the output of the I/O port adapter 34 on bus 35 is coupled to a range selector and power control 36 which also may be part of the boards in the host computer 29.

The power control 36 generates an analog signal on line 37 to voltage controlled oscillator 38 which sets the center frequency $F_C$ or the resonant frequency $F_C$ as explained hereinbefore. The frequency and voltage at the output of VCO 38 on line 39 is applied to a power amplifier 41 as explained hereinbefore to produce a current driving signal on output line 42 connected through the transducer 43 and a calibration resistor R to ground. The voltage across the transducer 43 is sensed on voltage sense line 44 and the current through the resistor R is sensed on current sense line 45. The signals on lines 44 and 45 are applied to a preferred embodiment phase detector 46 which may be a commercially available chip or made from simple and reliable, discreet devices as will be explained hereinafter. The output of the phase detector 46 generates a voltage signal $V_E$ on line 47 when the phase of the signals on lines 44 and 45 are not identical. In the preferred embodiment shown a loop filter 48 is employed to smooth the signal on line 47 and provide a DC output on line 49 which is applied as an input to the negative side of a simple comparator 51. The positive side of the comparator 51 is provided with a voltage reference signal on line 52 to provide a digital signal output on line 53 which is coupled back through the I/O port adapter 34 to the host CPU 29. It will be understood that the phase detector 46, loop filter 48 and comparator 51 are designed to generate the output signal on line 53 within several cycles of the resonant frequency of the transducer 43 which equals approximately 8 microseconds for a 120 kilohertz resonant frequency of the transducer. The touch down signal on line 53 to the host CPU 29 enables the host CPU to immediately generate a force signal on line 54 to the Z-drive motor 55 which controls the Z-drive motor within microseconds of the time of touch down detected at the comparator 51. Further, it will be appreciated that the Z-drive motor when being moved or driven to its touch down position is not in a force mode but is in a position mode and the force being applied is much lower than that which would be applied in the force mode. Thus, by immediately switching from the position mode to the force mode under control of the CPU, the impact force applied to a bonding target through the bonding tool can be completely controlled and is known at the time of impact.

Figure 3:
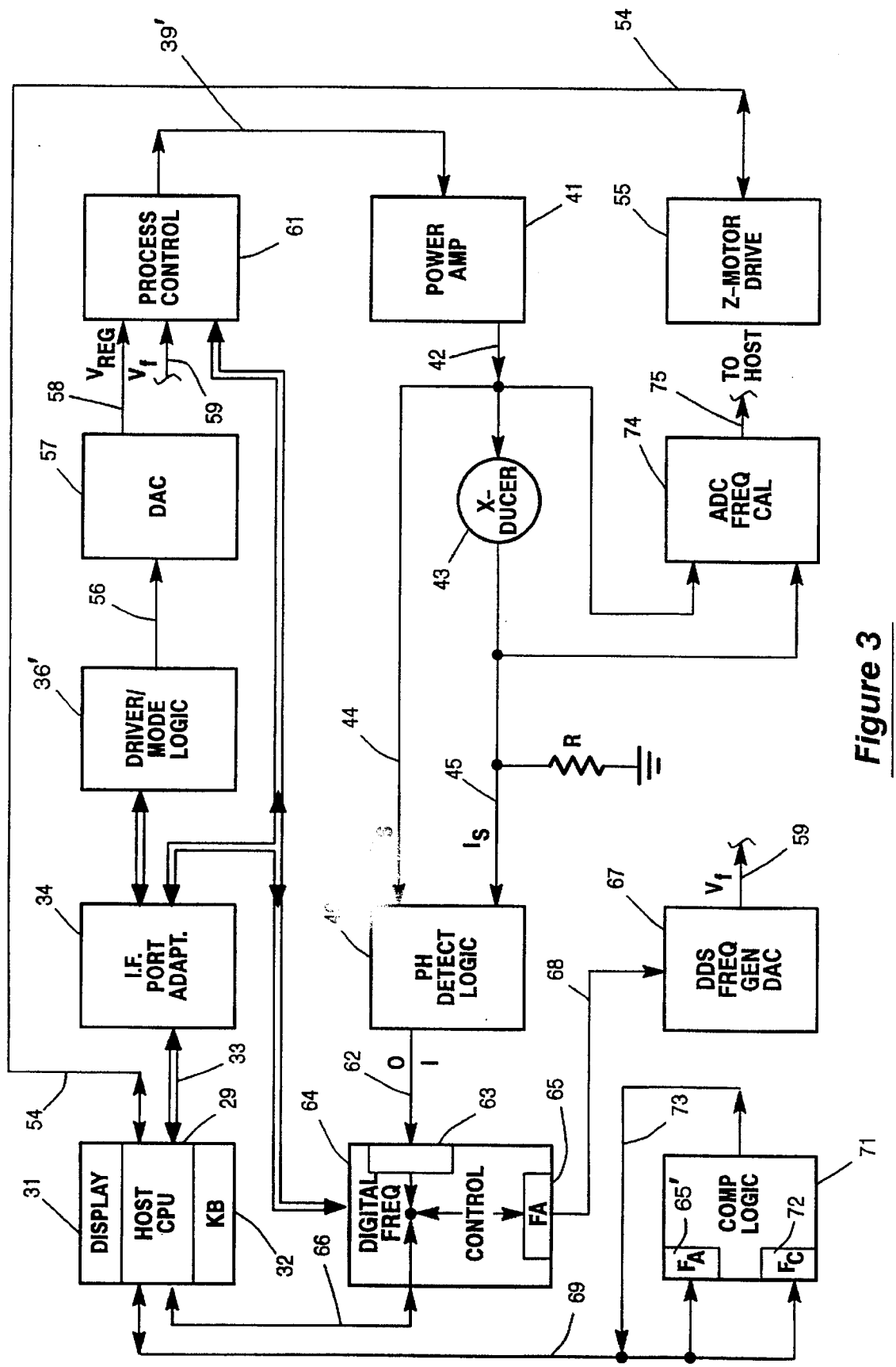
FIG. 3 is a schematic block diagram of a programmable digital controlled ultrasonic generator for driving an ultrasonic transducer at different resonance frequencies and for controlling a Z-axis drive motor.

Refer now to FIG. 3 showing a schematic block diagram of a programmable digital controlled ultrasonic generator for driving a ultrasonic transducer at different resonant frequencies and for detecting touch down and controlling the Z-drive motor. The elements shown in FIG. 2 which are identical to those shown in FIG. 3 have been numbered the same and operate in the same manner and do not require additional explanation herein. The host CPU is generating command information through the I/O ports in port adapter 34 which are applied to a driver mode logic 36' to generate a variable digital signal on line 56 that is applied to a digital to analog converter 57. The analog signal output on line 58 may now be variable and is applied to a process controller 61 to generate variable voltages on output line 39' to the power amplifier 41. It will be appreciated that the driver mode logic and process control 61 will enable the power amplifier to be driven at a voltage which is needed to drive the transducer 43 in a constant current mode, a constant voltage mode, or a constant impedance or power mode as needed.

The output of the power amplifier on line 42 is applied across the transducer 43 as explained hereinbefore to produce the $V_S$ and $I_S$ signals which were applied to a phase detector logic 46. In this particular embodiment, the phase detector 46 must be a digital detector for generating either a 0 or a 1 on output line 62 indicative a desired decrease or increase of the frequency of the generator. The signal on line 62 is applied to a up down counter 63 in the digital frequency control 64 which is provided with an output register 65 which maintains the desired actual frequency in generator 67. Register 65 is preferably a command register for controlling the digital direct synthesizer (DDS) frequency generator 67 via line 68. The DDS 67 are commercially available as chips which include a digital to analog converter that produces the voltage frequency control signal on output line 59 for controlling the frequency. Further, the host computer 29 is coupled to the digital frequency control 64 via line 66 for continuously reading the frequency as desired.

For purposes of explaining the novel method of detecting touchdown in FIG. 3 there is shown a bus 69 connecting to the host computer 29 and to a comparison logic block 71. The comparison logic 71 contains a register 65A' with the actual frequency ($F_A$) and a register 72 with the resonant frequency $F_C$. When the transducer 43 is in air under no load, $F_C$ equals $F_A$ and upon touch down the frequency $F_A$ changes as explained hereinbefore and this change is sensed on touch down sensing line 73 which is coupled to the host computer 29 via bus 69. It will be appreciated that the comparison logic 71 is shown outside of the host CPU 29 but could very well be accomplished within the host computer using software since all of the needed values are available there. Once the host computer 29 senses that the bonding tool has made contact with the bonding target, it can initiate a force signal on line 54 which is coupled to the aforementioned Z-axis drive motor 55.

In order to calibrate the frequencies employed in the above method, it is desirable to sense the $V_S$ and $I_S$ signals on lines 44 and 45 and input them into an ADC frequency calibration device 74 which is coupled to the host computer via line 75. In this manner, the resonant frequency in air or under load can be calibrated for use in the host computer 29.

Figure 4:
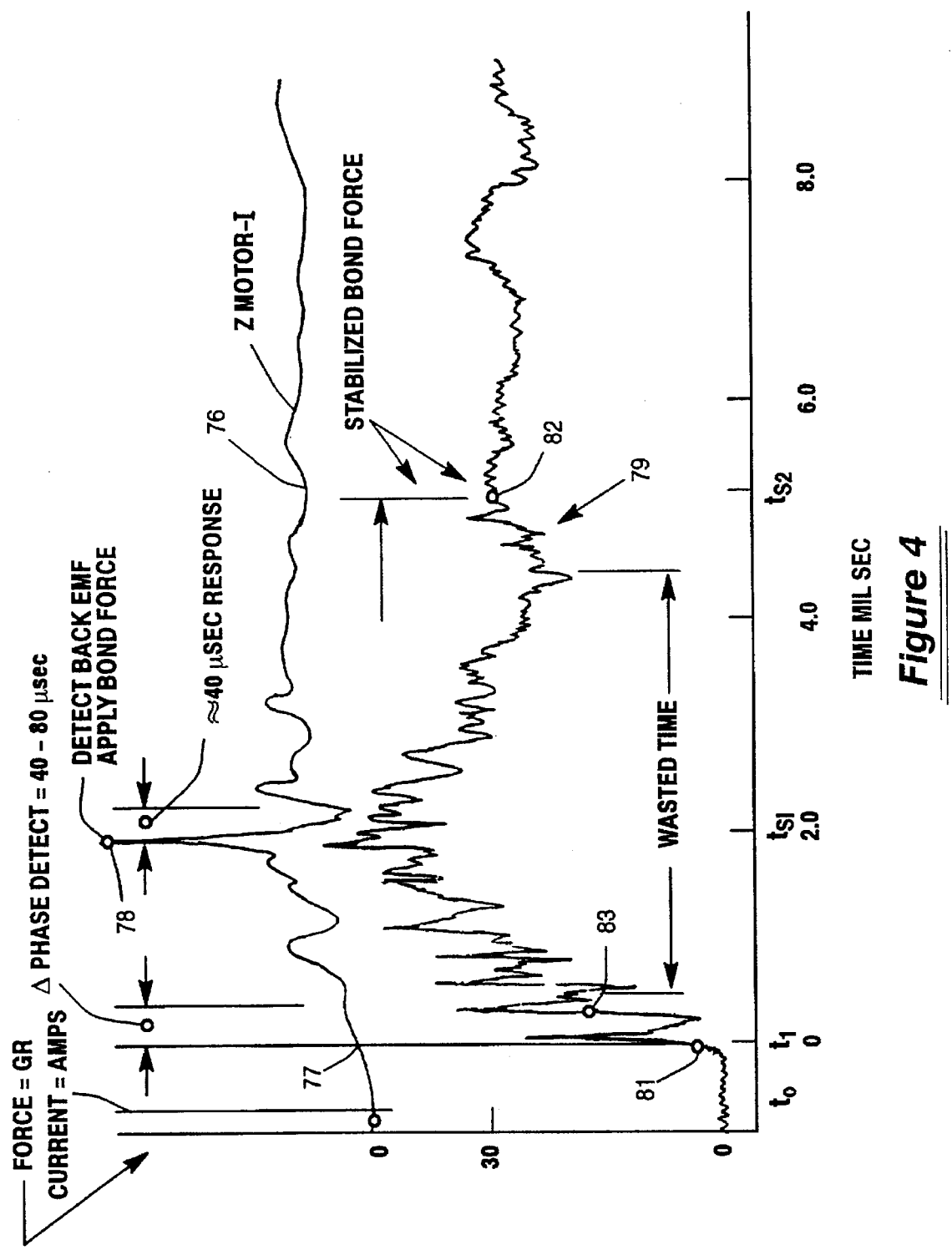
FIG. 4 is a wave form drawing showing force versus time and Z-axis drive motor current versus time for a typical bonding operation illustrating time wasted in prior art sensing circuits.

Refer now to FIG. 4 showing a pair of waveform drawings in which force versus time and Z-axis drive motor current versus time are shown on the same time base diagram. For purposes of explanation, the current to the Z-axis drive motor 55 is shown as waveform 76. Thus, at time T0 in the position mode, the current across the Z drive motor is substantially zero. However, when the bonding tool touches down on a bonding target at time T1 and point 77, the computer is driving the motor 55 in the position mode and rapidly increases the current to effect a desired Z position which is not possible. When the computer driving the Z-axis motor reaches time TS1 at point 78, the current of waveform 76 has spiked which may be easily sensed in approximately 40 microseconds thereafter shown as the response time, the Z-axis motor may be converted to the force mode in which case the current drops substantially below the average needed for the force mode. Then the current seeks or oscillates until it reaches a control level point 82 as shown at time TS2.

Waveform 79 shows the bonding force being applied to the bonding target as being at zero until point 81 is reached which is the actual touch down point. Using the novel phase and frequency detectors explained hereinbefore with reference to FIGS. 2 and 3, it is possible to detect this touch down point 81 within approximately 40 microseconds which is indicative of several cycles of the frequency of the ultrasonic generator. It will be appreciated that waveform 79 has a portion indicated as wasted time wherein the force being applied by the current on the Z-drive motor rises rapidly and then drops rapidly once the prior art type force detection system senses the touch down point at point 78 of waveform 76. It is not until point 82 on waveform 79 that a stable bonding force was heretofore applied to the bonding tool.

Note that at point 83 of waveform 79 using the present invention, the Z-drive motor can be switched into the force mode well below point 82 which shows that it is possible to generate a waveform which is completely smooth and gradually increases from point 83 to point 82 over a matter of several microseconds, thus, eliminating the overshoot shown in the portion labeled wasted time as well as the undershoot which occurred after the wasted time. Since the curve shown in FIG. 4 were obtained by empirical methods, it is shown that at least two full milliseconds may be saved when making each wire bond. Further, employing the present method and apparatus the force applied to the bonding wire at the time of impact can be completely controlled and anticipated so that it is much lower than the desired bonding force for making a bond, thus improving bond quality and repeatability as well as avoiding any damage which could occur due to excessive impact forces.

Figure 5:
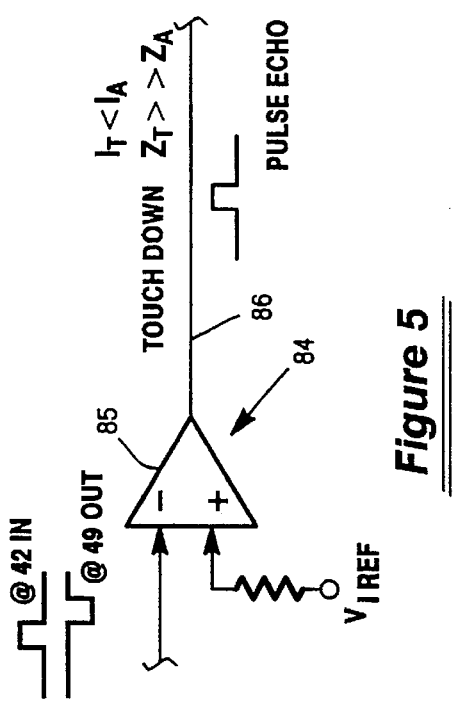
FIG. 5 is a schematic diagram of a high speed phase detector logic circuit for detecting touch down of a bonding tool on a bonding target of a semiconductor device to be bonded.

Refer now to FIG. 5 showing a high speed touch down detector logic circuit 84 shown as a simple IC comparator 85. Employing this simple device, a pulse is applied across the transducer on line 42 and a signal is sensed at output line 49. If the positive pulse signal on line 42 comes back as a positive pulse, the transducer is still in air. However, once the transducer touches down and the impedance under load essentially changes from an open circuit to a short circuit, the phase of the pulse on line 42 is reversed 180° and is sensed as a negative pulse input and a positive pulse output on line 86. The pulse echo method of sensing touch down is programmed in the host computer 29 and is carried out periodically as the computer is driving the bonding tool in the position mode before touch down.

Figure 6:
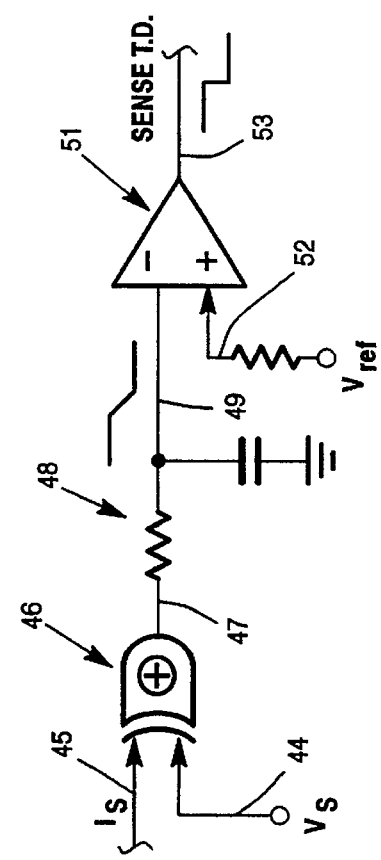
FIG. 6 is a schematic diagram of another high speed phase detector for detecting touch down of a bonding tool on a bonding target.

Refer now to FIG. 6 showing a schematic diagram of another high speed touch down detector implemented by sensing the voltage on line 45 and the voltage on line 44. The voltages sensed on lines 44 and 45 are applied to an exclusive OR circuit 46 which in this embodiment operates as a phase detector. The output on line 47 is applied through a resistor and a capacitor to ground which operates as a loop filter 48. The loop filter generates a DC signal which goes from high to low as shown on line 49' and is applied as a negative input to the comparator 51' which also has a positive input as a V ref on line 52. The output of the circuit shown in FIG. 6 produces the aforementioned touch down on the loop filter output line 53 which is applied via the I/O ports to the host computer as explained hereinbefore. The logic circuitry shown in FIG. 6 may be implemented as hardware but may also be implemented in software employing a digital signal processor chip.

Figure 7:
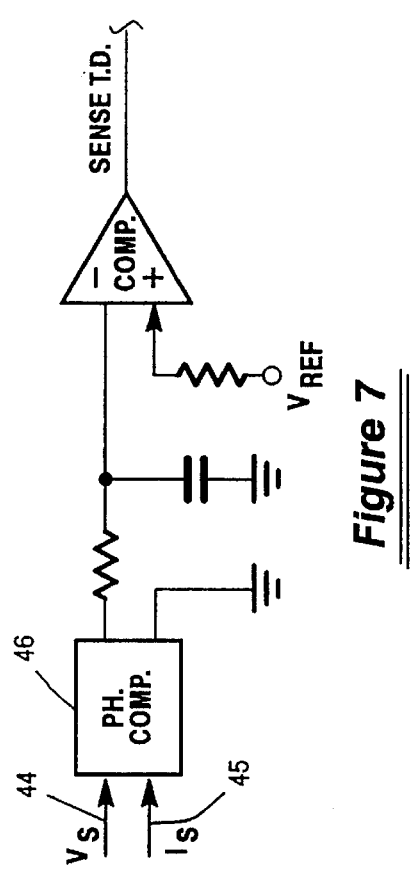
FIG. 7 is a schematic drawing of a preferred embodiment logic circuit for detecting a change in phase between current and voltage which occurs instantaneously at the time of touch down of a bonding tool on a bonding target.

Refer now to FIG. 7 showing a schematic drawing of another preferred embodiment logic circuit for detecting touch down as a change in phase between current and voltage which occurs on lines 45 and 44 as an input to the phase comparator 46. In this embodiment, the loop filter and comparator may be the same as before, however, the phase detector is preferably implemented as a charge pump phase detector 46' which are commercially available and well known.

Figure 8:
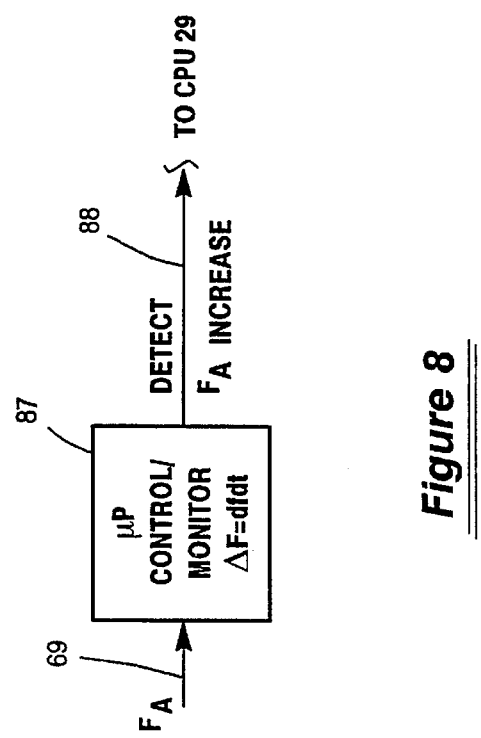
FIG. 8 is a schematic drawing of a preferred embodiment logic circuit for detecting a change in frequency which occurs instantaneously at the time of touch down of a bonding tool on the bonding target.

Refer now to FIG. 8 showing a schematic drawing of yet another logic circuit for detecting touch down as a change in frequency which occurs at the time of touch down of a bonding tool on a bonding target. As explained hereinbefore, the actual frequency that is on line 69 may be applied to a microprocessor controller 87 which is programmed to detect the differential change in frequency shown as $\Delta F$ and is equal to dfdt. A frequency change is capable of generating a touch down signal on line 88 which is connected to the host CPU 29. The reason for employing a separate microprocessor controller is that touch down may be detected faster than depending on the host computer 29 which is employed for other computer operations.

Having explained a preferred embodiment of the present invention and several modifications thereof, it will be appreciated that the present invention may be incorporated into existing automatic wire bonders as a new feature while manufacturing the wire bonder or may be retrofitted into wire bonders that are already in the field. Further, it will be understood that the operators of the automatic wire bonders may now conduct a series of tests on devices and lead frames and carriers to determine the maximum bond strength produced by different bond forces faster and more accurate than was heretofore possible. After making teach or test operations, it is now possible to repeat the identical forces and times more accurate than was heretofore possible.

What is claimed is:

1. A high speed detector for sensing contact of an ultrasonic bonding tool on a bonding target, comprising:

a ultrasonic generator, a power amplifier coupled to the output of said ultrasonic generator an ultrasonic transducer coupled to the output of said power amplifier, a bonding tool mounted in said ultrasonic transducer, phase detector means coupled across said ultrasonic transducer for detecting predetermine changes in electrical value when said bonding tool contacts said bonding target, computer control means coupled to said phase detector means responsive to said changes in electrical values which occur upon touch down of said bonding tool on said bonding target, and Z-axis drive motor means coupled to said computer means for positioning said bonding tool prior to touch down and for controlling the bonding force on said bonding tool within several cycles of said ultrasonic generator after actual contact or touch down of said bonding tool on said bonding target.

2. A high speed detector as set forth in claim 1 wherein said phase detector means comprises a digital detector circuit for sensing an out-of-phase condition between the voltage and current across said ultrasonic transducer indicative of a touch down condition.

3. A high speed detector as set forth in claim 2 wherein said phase detector means further comprises a comparator having a reference voltage input.

4. A high speed detector as set forth in claim 1 wherein said comparator comprises a summing amplifier.

5. A high speed detector as set forth in claim 3 wherein said comparator comprises an Exclusive OR GATE.

6. A high speed detector as set forth in claim 2 wherein said comparator comprises a digital frequency comparator for detecting a change in frequency upon touch down.

7. A high speed detector as set forth in claim 1 wherein said phase detector comprises a digital phase detector and a filter for generating on output signal indicative of touch down condition.

8. A high speed detector as set forth in claim 7 wherein said phase detector further includes an electronic comparator and said phase detector has a logic response time of less than 50 microseconds.

9. A high speed detector as set forth in claim 8 wherein said phase detector means has a logic response time of several cycles of said ultrasonic generator.

10. A high speed detector as set forth in claim 9 for reducing the current applied to said Z-axis drive motor in less than 10 cycles of said ultrasonic generator after actual touch down of said bonding tool on said bonding target.

11. A high speed detector as set forth in claim 10 wherein said current applied to said Z-axis drive motor is stabilized during the logic response time of said phase detector means.

12. A method of detecting contact of a bonding tool with a bonding target before a stabilized bonding force can be applied to a Z-axis drive motor, comprising the steps of:

connecting an ultrasonic transducer to the output of a power amplifier of an ultrasonic generator in an automatic wire bonder, driving said ultrasonic transducer at its resonant frequency and air before the bonding tool engages said bonding target, sensing the voltage ($V_S$) at the input of said ultrasonic transducer, sensing the voltage ($I_S$) indicative of the current through said ultrasonic transducer, detecting when the phase of the current and the phase of the voltage changes from zero to a detectable value, and changing the position mode of said Z-axis drive motor to a force mode before a substantial impact force occurs.

13. The method as set forth in claim 12 which further includes the steps of comparing the phase of the voltage and current in a phase detector with a reference voltage to confirm that a touch down condition has occurred.

\* \* \* \* \*